US012683120B2

(12) United States Patent
Inokuchi et al.

(10) Patent No.: US 12,683,120 B2
(45) Date of Patent: Jul. 14, 2026

(54) SUBSTRATE PROCESSING METHOD AND SUBSTRATE PROCESSING APPARATUS

(71) Applicant: Tokyo Electron Limited, Tokyo (JP)

(72) Inventors: Atsutoshi Inokuchi, Miyagi (JP); Yasuhiko Saito, Miyagi (JP); Kiyoshi Maeda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 464 days.

(21) Appl. No.: 18/032,786

(22) PCT Filed: Oct. 5, 2021

(86) PCT No.: PCT/JP2021/036741
§ 371 (c)(1),
(2) Date: Apr. 19, 2023

(87) PCT Pub. No.: WO2022/085424
PCT Pub. Date: Apr. 28, 2022

(65) Prior Publication Data
US 2023/0386787 A1 Nov. 30, 2023

(30) Foreign Application Priority Data

Oct. 19, 2020 (JP) ................................. 2020-175390
Dec. 28, 2020 (JP) ................................. 2020-218570

(51) Int. Cl.
*H01J 37/32* (2006.01)
*H10P 50/00* (2026.01)
*H10P 50/24* (2026.01)

(52) U.S. Cl.
CPC .. *H01J 37/32137* (2013.01); *H01J 37/32091* (2013.01); *H01J 37/321* (2013.01);
(Continued)

(58) Field of Classification Search
None
See application file for complete search history.

(56) References Cited

U.S. PATENT DOCUMENTS 8,759,214 B2 * 6/2014 Morgan ............ H01L 21/30655
438/700
2001/0044213 A1 * 11/2001 Pandhumsoporn .........................
H01L 21/30655
438/719
(Continued)

FOREIGN PATENT DOCUMENTS

JP H08-017807 A 1/1996
JP H0817807 * 1/1996
(Continued)

OTHER PUBLICATIONS

International Search Report (PCT/ISA/210) issued on Dec. 21, 2021, by the Japanese Patent Office as the International Searching Authority for International Application No. PCT/JP2021/036741. (4 pages).
(Continued)

*Primary Examiner* — Stephanie P Duclair
(74) *Attorney, Agent, or Firm* — XSENSUS LLP

(57) ABSTRACT

A substrate processing method for a substrate processing device includes (a) supplying a process gas with specific conditions to a processing container having therein a stage on which a workpiece having an etching target film and a mask on the etching target film is placed, (b) performing a plasma processing on the workpiece with first plasma generated from the process gas under a first plasma generation condition, (c) performing a plasma processing on the workpiece with second plasma generated from the process gas under a second plasma generation condition that is different from the first plasma generation condition in a radio-frequency power condition and a processing time, and is the same as the first plasma generation condition in other conditions, and (d) repeating (b) and (c).

22 Claims, 15 Drawing Sheets

(52) U.S. Cl.
CPC ........ *H01J 37/3244* (2013.01); *H10P 50/242* (2026.01); *H10P 50/691* (2026.01); *H01J 2237/334* (2013.01)

(56) References Cited

U.S. PATENT DOCUMENTS

| | | | |
|---|---|---|---|
| 2015/0072530 A1 | 3/2015 | Kim et al. | |
| 2015/0126033 A1* | 5/2015 | LeFevre | H01J 37/32091 |
| | | | 438/694 |
| 2018/0366335 A1 | 12/2018 | Tanaka et al. | |

FOREIGN PATENT DOCUMENTS

| | | |
|---|---|---|
| JP | 2000-323454 A | 11/2000 |
| JP | 2007-129260 A | 5/2007 |
| JP | 2013-021192 A | 1/2013 |
| JP | 2017-069542 A | 4/2017 |

OTHER PUBLICATIONS

Written Opinion (PCT/ISA/237) issued on Dec. 21, 2021, by the Japanese Patent Office as the International Searching Authority for International Application No. PCT/JP2021/036741. (5 pages).

* cited by examiner

SUBSTRATE PROCESSING METHOD AND SUBSTRATE PROCESSING APPARATUS

CROSS REFERENCE TO RELATED APPLICATIONS

This application is a 35 U.S.C. 371 National Phase Entry Application from PCT/JP2021/036741, filed on Oct. 5, 2021, which claims priority from Japanese Patent Application Nos. 2020-175390 filed on Oct. 19, 2020 and 2020-218570 filed Dec. 28, 2020, respectively, the disclosures of which are incorporated herein in their entirety by reference and priority is claimed to each of the foregoing.

TECHNICAL FIELD

The present disclosure relates to a substrate processing method and a substrate processing apparatus.

BACKGROUND

In recent years, as miniaturization of semiconductors progresses, the damages to the side walls of holes in the dry etching processes, such as the changes in the composition of the object and implantation, have become a problem. Meanwhile, for example, it has been proposed to reduce the damage to the side walls by repeating a step of depositing a protective film and an etching step.

PRIOR ART DOCUMENT

Patent Document

Patent Document 1: Japanese Patent Laid-Open Publication No. 2013-021192

Patent Document 2: Japanese Patent Laid-Open Publication No. 2007-129260

SUMMARY OF THE INVENTION

Problems to be Solved

The present disclosure provides a substrate processing method and a substrate processing apparatus capable of performing etching at a higher speed and with less damage, as compared to a gas switching method.

Means to Solve the Problems

A substrate processing method according to one aspect of the present disclosure is a substrate processing method for a substrate processing apparatus, including: (a) supplying a process gas with a specific condition, to a processing container having therein a stage on which a workpiece having an etching target film and a mask on the etching target film is placed; (b) performing a plasma processing on the workpiece with first plasma generated from the process gas under a first plasma generation condition; (c) performing a plasma processing on the workpiece with second plasma generated from the process gas under a second plasma generation condition that is different from the first plasma generation condition in a radio-frequency condition and a processing time, and is the same as the first plasma generation condition in other conditions; and (d) repeating (b) and (c).

Effect of the Invention

According to the present disclosure, it is possible to perform etching at a higher speed and with less damage, as compared to the gas switching method.

DETAILED DESCRIPTION TO EXECUTE THE INVENTION

Hereinafter, embodiments of a substrate processing method and a substrate processing apparatus according to the present disclosure will be described in detail based on the drawings. The present disclosure is not limited to the embodiments.

In an etching processing in which a step of depositing a protective film and an etching step are repeated, a process gas to be used is switched, and thus, it takes time to replace the process gas in the processing container. As a result, the processing time is extended, and the throughput is lowered. Therefore, it is expected to perform etching at a higher speed and with less damage, as compared to the gas switching method.

First Embodiment

Configuration of Plasma Processing Apparatus 100

Figure 1:
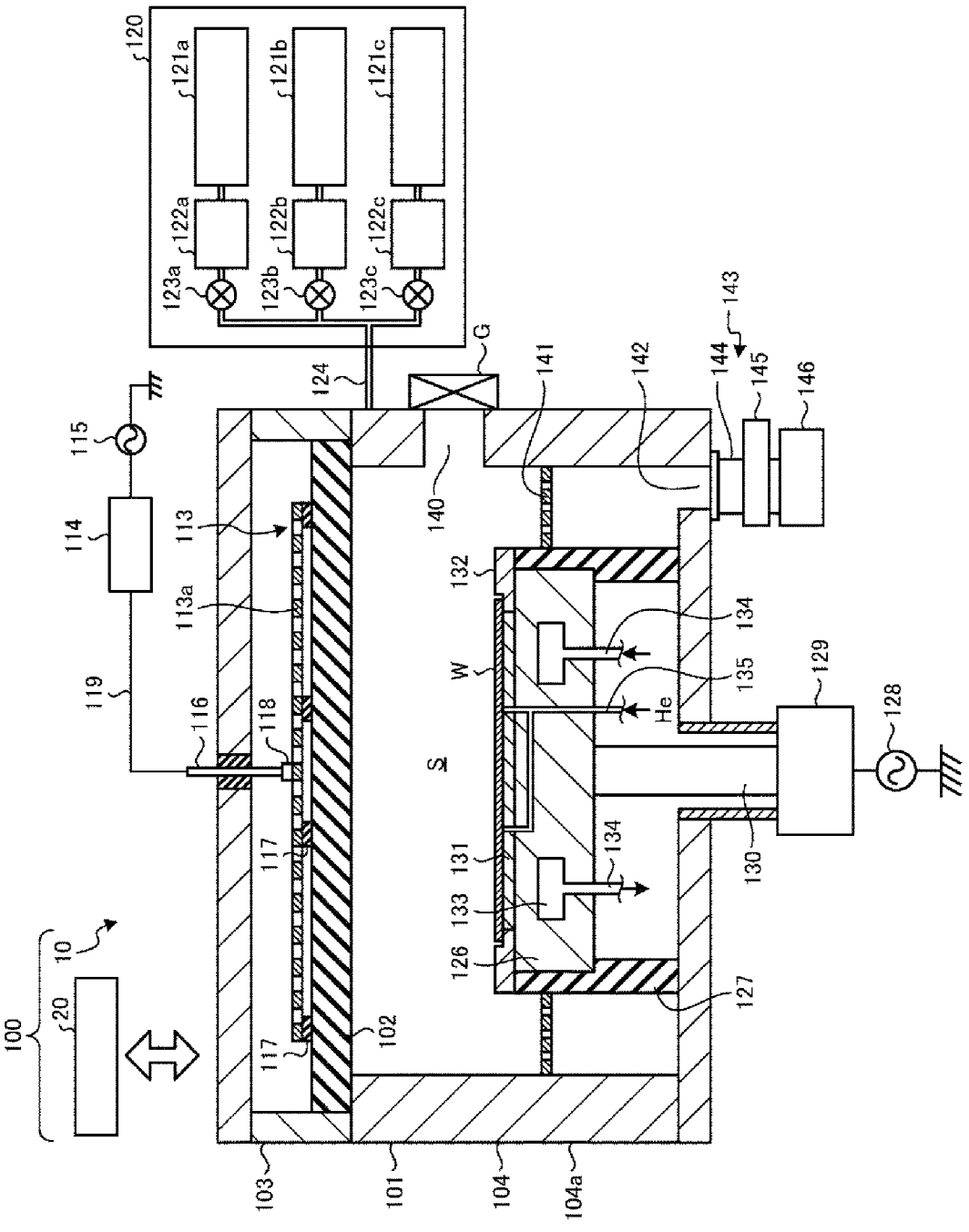
FIG. 1 is a view illustrating an example of a plasma processing apparatus according to a first embodiment of the present disclosure.

FIG. 1 is a view illustrating an example of a plasma processing apparatus according to a first embodiment of the present disclosure. The plasma processing apparatus 100 includes a main body 10 and a control unit 20. The plasma processing apparatus 100 according to the present embodiment performs an etching processing on an etching target film formed on a semiconductor wafer (hereinafter, also referred to as a wafer) W, which is an example of w workpiece, using an inductively coupled plasma (ICP). In the present embodiment, the semiconductor wafer W is formed with, for example, an etching target film and a mask on the etching target film.

The main body 10 includes a substantially cylindrical airtight chamber 101 made of, for example, aluminum of which the inner wall surface is anodized. The chamber 101 is grounded. The chamber 101 is vertically partitioned by an upper ceiling plate 102. An antenna chamber 103 is provided on the upper surface side of the upper ceiling plate 102 to accommodate an antenna 113. Further, a processing chamber 104 is provided on the lower surface side of the upper ceiling plate 102 to generate plasma. In the present embodiment, the upper ceiling plate 102 is made of quartz and constitutes the ceiling wall of the processing chamber 104. The upper ceiling plate 102 may be made of ceramics such as $Al_2O_3$.

A side wall 104a of the processing chamber 104 is provided with a gas supply pipe 124, one end of which communicates with a space S in the processing chamber 104 and the other end of which communicates with a gas supply mechanism 120. The gas supplied from the gas supply mechanism 120 is supplied into the space S via the gas supply pipe 124. The gas supply mechanism 120 includes gas supply sources 121a to 121c, mass flow controllers (MFC) 122a to 122c, and valves 123a to 123c. The gas supply mechanism 120 is an example of a gas supply.

The MFC 122a is connected to the gas supply source 121a that supplies a carbon-containing gas, and controls the flow rate of the carbon-containing gas supplied from the gas supply source 121a. In the present embodiment, the gas supply source 121a supplies, for example, $C_4F_8$ gas or $C_4F_6$ gas. The valve 123a controls the supply and stop of the supply of the carbon-containing gas whose flow rate is controlled by the MFC 122a to the gas supply pipe 124.

The MFC 122b is connected to the gas supply source 121b that supplies a halogen-containing gas, and controls the flow rate of the halogen-containing gas supplied from the gas supply source 121b. In the present embodiment, the gas supply source 121b supplies, for example, $SF_6$ gas. The valve 123b controls the supply and stop of the supply of the halogen-containing gas whose flow rate is controlled by the MFC 122b to the gas supply pipe 124.

The MFC 122c is connected to the gas supply source 121c that supplies a noble gas, and controls the flow rate of the noble gas supplied from the gas supply source 121c. In the present embodiment, the gas supply source 121c supplies, for example, Ar gas. The valve 123c controls the supply and stop of the supply of the noble gas whose flow rate is controlled by the MFC 122c to the gas supply pipe 124.

The antenna 113 is arranged in the antenna chamber 103. The antenna 113 has an antenna wire 113a made of highly conductive metal such as copper or aluminum. The antenna wire 113a is formed in an arbitrary shape such as a ring shape or a spiral shape. The antenna 113 is separated from the upper ceiling plate 102 by a spacer 117 made of an insulating member.

A terminal 118 of the antenna wire 113a is connected with one end of a feeding member 116 that extends upward from the antenna chamber 103. The other end of the feeding member 116 is connected with one end of a feeding line 119, and the other end of the feeding line 119 is connected with a radio-frequency power supply 115 via a matcher 114. The radio-frequency power supply 115 supplies a radio-frequency power with a frequency of 10 MHz or higher (e.g., 27 MHz) to the antenna 113 via the matcher 114, the feeding line 119, the feeding member 116, and the terminal 118. As a result, an induced electric field is formed in the space S in the processing chamber 104 below the antenna 113, and the induced electric field converts the gas supplied from the gas supply pipe 124 into plasma, so that an inductively coupled plasma is generated in the space S. The antenna 113 is an example of a first plasma generator. In the following description, the radio-frequency power supplied from the radio-frequency power supply 115 may be referred to as a second radio-frequency power, source, or Source.

The bottom wall of the processing chamber 104 is provided with a disc-shaped susceptor 126 made of a conductive material such as aluminum, on which a wafer W to be processed is placed. The susceptor 126 also functions as an electrode for drawing ions in the generated plasma (biasing). The susceptor 126 is supported by a cylindrical susceptor support 127 made of an insulator.

Further, the susceptor 126 is connected with a radio-frequency power supply 128 for bias via a feed rod 130 and a matcher 129. The susceptor 126 is supplied with a radio-frequency power having a frequency of 10 MHz or higher (e.g., 13 MHz) from the radio-frequency power supply 128. In the following description, the radio-frequency power supplied from the radio-frequency power supply 128 may be referred to as a first radio-frequency power, bias, or Bias. Further, the radio-frequency power supply 128 acts for plasma excitation, and plasma may be generated in the space S. The plasma at this time is capacitively coupled plasma (CCP).

An electrostatic chuck 131 is provided on the upper surface of the susceptor 126 to hold the wafer W by an electrostatic adsorption force, and an edge ring 132 is provided on the outer peripheral side of the electrostatic chuck 131 to surround the periphery of the wafer W. The edge ring 132 may also be referred to as a focus ring.

Further, a flow path 133 is formed inside the susceptor 126 to allow a coolant such as cooling water to flow therethrough. The flow path 133 is connected to a chiller unit (not illustrated) via a pipe 134, and a temperature-controlled coolant is supplied from the chiller unit to the flow path 133 via the pipe 134.

Inside the susceptor 126, a gas supply pipe 135 is provided between the electrostatic chuck 131 and the wafer W to supply a heat transfer gas such as He gas. The gas supply pipe 135 passes through the electrostatic chuck 131, and the space inside the gas supply pipe 135 communicates with the space between the electrostatic chuck 131 and the wafer W. Furthermore, the susceptor 126 is provided with a plurality of lift pins (not illustrated) for transferring the wafer W so as to protrude from the upper surface of the electrostatic chuck 131.

A side wall 104a of the processing chamber 104 is provided with a loading/unloading port 140 to load the wafer W into the processing chamber 104 and unload the wafer W from the processing chamber 104. The loading/unloading port 140 is opened and closed by a gate valve G. When the gate valve G is controlled to be in an open state, the wafer W is able to be loaded and unloaded through the loading/unloading port 140. Further, an annular baffle plate 141 having a plurality of through holes is provided between the outer wall of the susceptor support 127 and the side wall 104a of the processing chamber 104.

An exhaust port 142 is formed at the bottom wall of the processing chamber 104, and an exhaust mechanism 143 is provided in the exhaust port 142. The exhaust mechanism 143 includes an exhaust pipe 144 connected to the exhaust port 142, an auto pressure controller (APC) valve 145 that controls the pressure inside the processing chamber 104 by adjusting the opening degree of the exhaust pipe 144, and a vacuum pump 146 that evacuates the inside of the processing chamber 104 through the exhaust pipe 144. The inside of the processing chamber 104 is evacuated by the vacuum pump 146, and the inside of the processing chamber 104 is maintained at a predetermined degree of vacuum by adjusting the opening degree of the APC valve 145 during the plasma etching processing.

The control unit 20 has a memory such as a read only memory (ROM) and a random access memory (RAM), and processors such as a central processing unit (CPU). The processor in the control unit 20 controls each unit of the main body 10 by reading and executing a program stored in the memory in the control unit 20. The specific processing performed by the control unit 20 will be described later.

Figure 2:
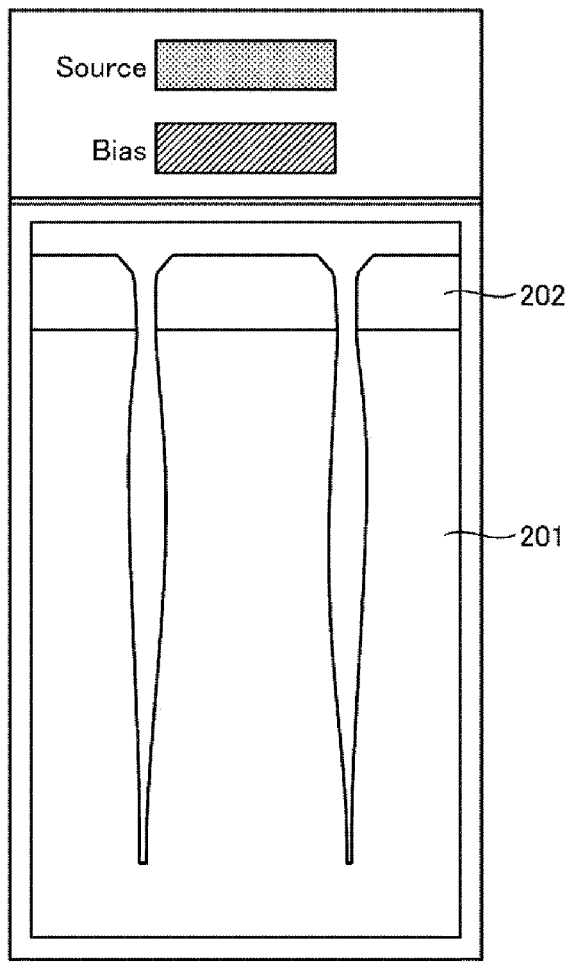
FIG. 2 is a view illustrating an example of etching by high dissociation plasma.
Figure 3:
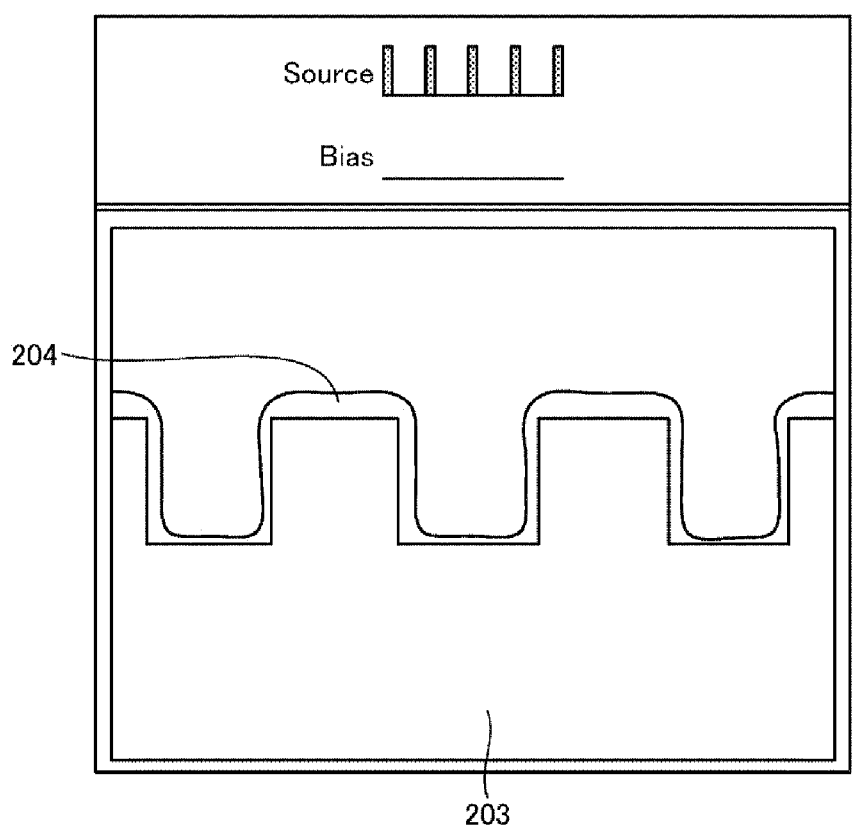
FIG. 3 is a view illustrating an example of deposition by low dissociation plasma.

Switching between Etching and Deposition according to Dissociation Degree of Plasma Here, descriptions will be made on switching between etching and deposition according to the dissociation degree of plasma with reference to FIGS. 2 and 3. FIG. 2 is a view illustrating an example of etching by high dissociation plasma. FIG. 3 is a view illustrating an example of deposition by low dissociation plasma. In FIG. 2, a silicon film is used as the etching target film on the wafer W, and a silicon oxide film is used as the mask. Further, in FIG. 3, a deposit is formed on the silicon film on the wafer W.

In FIGS. 2 and 3, the process gas is a mixed gas of $SF_6$, $C_4F_8$, $C_4F_6$, and Ar at a predetermined flow rate as a common specific condition. Further, the pressure in the processing chamber 104 is 20 mTorr, and the processing time is 300 seconds.

FIG. 2 illustrates an example of the plasma processing in a case where a radio-frequency power (Source) supplied from the radio-frequency power supply 115 is set to 900 W (continuous wave (CW)), and a radio-frequency power (Bias) supplied from the radio-frequency power supply 128 is set to 150 W (CW). In this case, as illustrated in FIG. 2, it can be seen that a silicon film 201 is etched according to a mask 202 by high dissociation plasma.

FIG. 3 illustrates an example of the plasma processing in a case where a radio-frequency power (Source) supplied from the radio-frequency power supply 115 is set to 900 W (1 kHz, duty ratio of 5%), and a radio-frequency power (Bias) supplied from the radio-frequency power supply 128 is set to 0 W. In this case, as illustrated in FIG. 3, it can be seen that a deposit 204 is etched according to a mask 204 by low dissociation plasma. That is, it is found that, by controlling the radio-frequency power to be applied and switching between low dissociation plasma and high dissociation plasma, the deposition of the protective film and the etching may be repeated.

Figure 4:
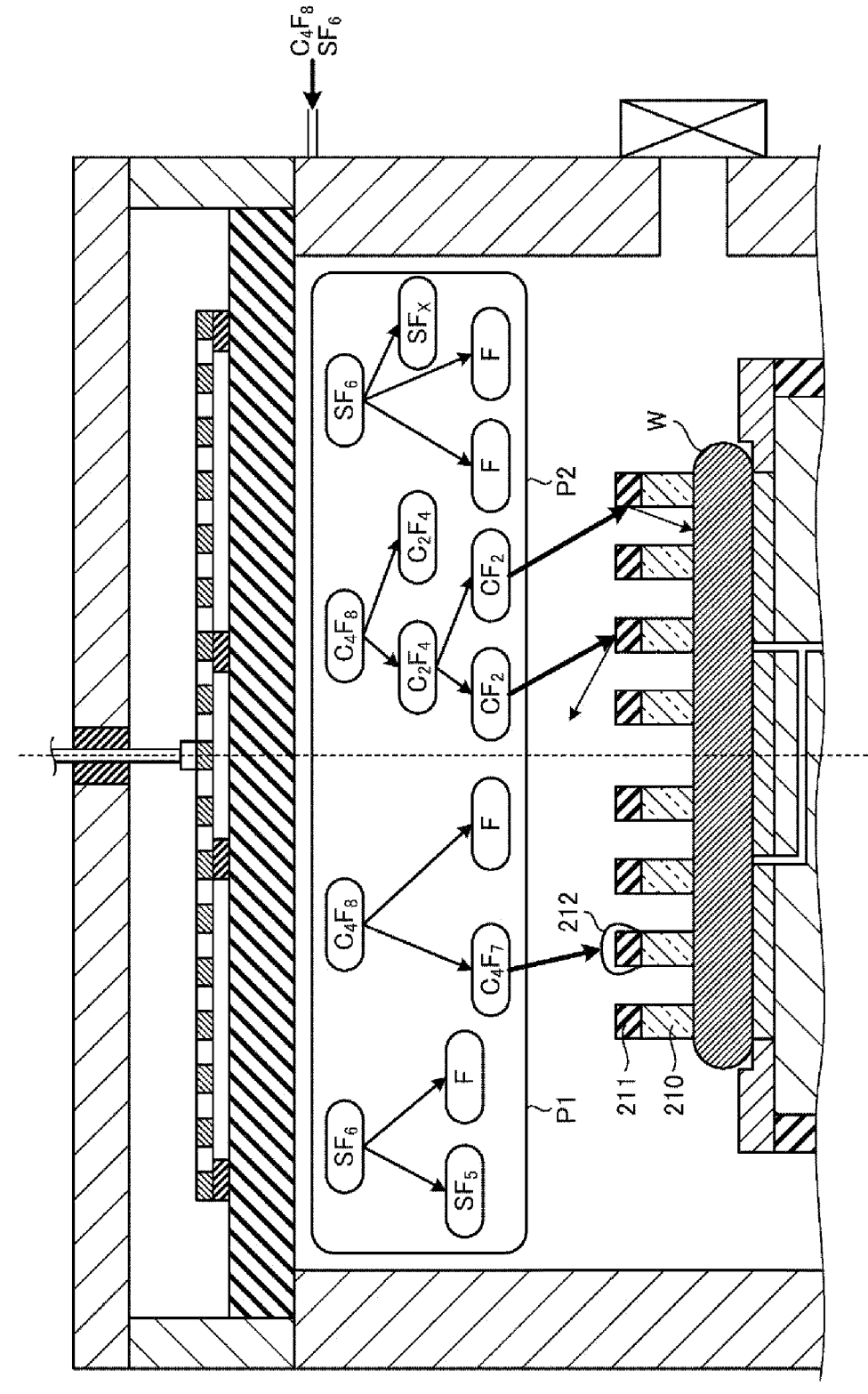
FIG. 4 is a view illustrating an example of reactions by high dissociation plasma and low dissociation plasma in the first embodiment.

Next, the reaction in each plasma will be described with reference to FIG. 4. FIG. 4 is a view illustrating an example of reactions by high dissociation plasma and low dissociation plasma in the first embodiment. FIG. 4 schematically illustrates reaction states in low dissociation plasma P1 in the left half of the figure and in high dissociation plasma P2 in the right half so as to be viewed at a glance. As illustrated in FIG. 4, the processing chamber 104 is introduced with a fluorocarbon gas such as $C_4F_8$ or $C_4F_6$ as a main gas, and a halogen-containing gas such as $SF_6$ or $NF_3$ as an additive gas. It is desirable that the halogen-containing gas does not contain carbon. Further, since the halogen-containing gas is supplied to supplement the etchant, it may not be supplied in some cases. Furthermore, it is assumed that an etching target film 210, which is a silicon film, and a mask 211, which is a silicon oxide film, are formed on the wafer W. The wafer W, the etching target film 210, and the mask 211 are schematically illustrated in an enlarged scale.

In the low dissociation plasma P1, $C_4F_8$ is dissociated into, for example, $C_4F_7$ and F, and $SF_6$ is dissociated into, for example, $SF_5$ and F. In this case, while $C_4F_7$ is generated as a large amount of deposits, the etchant (F) generated from $SF_6$ is in a small amount. Since $C_4F_7$ has a high adhesion coefficient, a deposit (reaction product) 212 is formed on the mask 211 and on the side wall of the hole in the etching target film 210. That is, a precursor is generated in the low dissociation plasma P1 and forms a deposit on the wafer W. In the following description, the low dissociation plasma P1 may be referred to as the first plasma.

Meanwhile, in the high dissociation plasma P2, $C_4F_8$ is dissociated into, for example, $C_2F_4 \rightarrow CF_2$, and also dissociated into $CF_2 \rightarrow CF$ and F. Further, $SF_6$ is dissociated into, for example, $SF_x$ and a plurality of F's. In this case, a large amount of etchant ($CF_2$, F) is generated. Further, since $CF_2$ has a low adhesion coefficient, it reaches the bottom of the hole, so that the etching progresses. That is, a precursor is generated in the high dissociation plasma P2 and etches the etching target film. In the following description, the high dissociation plasma P1 may be referred to as the second plasma.

Etching Method

Figure 5:
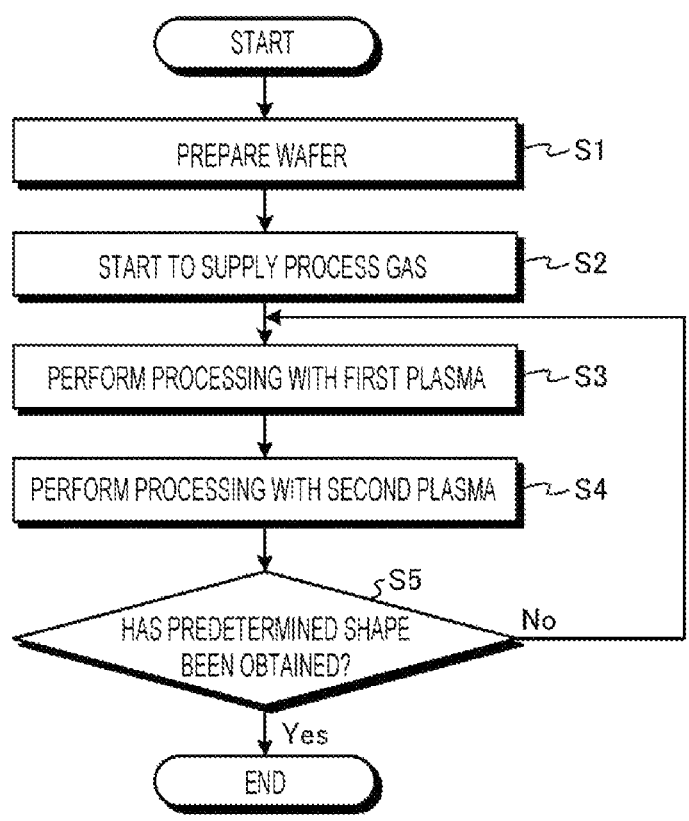
FIG. 5 is a flowchart illustrating an example of the etching processing in the first embodiment.

Next, an etching method according to the first embodiment will be described. FIG. 5 is a flowchart illustrating an example of the etching processing in the first embodiment.

In the etching method according to the first embodiment, the control unit 20 opens the gate valve G of the loading/unloading port 140, and a wafer W having the mask 211 formed on the etching target film 210 is loaded into the processing chamber 104 and placed on the electrostatic chuck 131 of the susceptor 126. The wafer W is held by the electrostatic chuck 131 by applying a DC voltage to the electrostatic chuck 131. Then, the control unit 20 closes the gate valve G and controls the exhaust mechanism 143 to exhaust the gas from the space S such that the atmosphere of the space S reaches a predetermined degree of vacuum.

Further, the control unit 20 controls a temperature control module (not illustrated) to adjust the temperature of the wafer W to a predetermined temperature (step S1).

Next, the control unit 20 starts to supply the process gas (step S2). The control unit 20 supplies a mixed gas of $C_4F_8$, $C_4F_6$, $SF_6$, and Ar to the processing chamber 104 via the gas supply pipe 124, as a process gas containing fluorocarbon gases, halogen-containing gases, and noble gases. The supplied mixed gas fills the space S in the processing chamber 104. The fluorocarbon gases may be any other compounds having a carbon-fluorine bond, such as $CF_2$ and $C_3F_4$. Further, hydrofluorocarbon gases such as $CHF_3$ and $CH_2F_2$ may also be used. In the first embodiment, the process gas conditions are the same until the etching processing is completed.

The control unit 20 controls the radio-frequency power supply 128 to supply a first radio-frequency power (bias) for plasma excitation and bias to the susceptor 126. By supplying the first radio-frequency power for plasma excitation and bias to the susceptor 126, plasma is generated from the mixed gas in the space S. That is, in the space S, a precursor that forms a deposit is generated by the first plasma (low dissociation plasma P1) generated by the first radio-frequency power. The wafer W is subjected to a plasma processing by the generated plasma. That is, the control unit 20 performs a plasma processing on the wafer W with the first plasma generated from the process gas under a first plasma generation condition (step S3). The wafer W is exposed to the first plasma, and a deposit (reaction product) 212 is formed on the mask 211 and on the side wall of the hole in the etching target film 210. The first plasma is capacitively coupled plasma (CCP) generated by the first radio-frequency power applied to the susceptor 126.

The control unit 20 controls the radio-frequency power supply 115 to supply a second radio-frequency power (source) for plasma excitation to the antenna 113. By the induced electric field formed in the space S, plasma is generated from the mixed gas. That is, in the space S, a precursor that etches the etching target film 210 is generated by the second plasma (high dissociation plasma P2) generated by the second radio-frequency power. Further, the control unit 20 controls the radio-frequency power supply 128 to supply a first radio-frequency power (bias) for bias, which is lower in output than in step S3, to the susceptor 126. The wafer W is subjected to a plasma processing by the generated plasma. That is, the control unit 20 performs a plasma processing on the wafer W with the second plasma generated from the process gas under a second plasma generation condition that is different from the first plasma generation condition in a radio-frequency condition and a processing time, and is the same as the first plasma generation condition in other conditions (step S4). The wafer W is exposed to the second plasma, and ions and radicals are drawn into the wafer W by the bias potential, so that etching of the etching target film that is not masked by the mask 211 progresses. The time during which the etching is performed with the second plasma in step S4 is set such that the deposit formed on the side wall of the hole in step S3 are not removed, that is, the side wall is not damaged.

The control unit 20 determines whether or not a predetermined shape is obtained through steps S3 and S4 (step S5). When it is determined that the predetermined shape is not obtained (step S5: No), the control unit 20 returns the process to step S3. Meanwhile, when it is determined that the predetermined shape has been obtained (step S5: Yes), the control unit 20 ends the processing. The control unit may include a step of stopping the supply of the first radio-frequency power and the second radio-frequency power to stop the generation of plasma for a predetermined time, between steps S3 and S4 or between steps S4 and S5.

When the processing is ended, the control unit 20 stops the supply of the process gas. Further, the control unit 20 applies a DC voltage having the opposite polarity to the electrostatic chuck 131 to remove the static electricity, so that the wafer W is separated from the electrostatic chuck 131. The control unit 20 opens the gate valve G. The wafer W is unloaded from the space S of the processing chamber 104 through the loading/unloading port 140. Therefore, it is possible to perform etching at a higher speed and with less damage, as compared to the gas switching method. Further, it is possible to achieve both a high mask selectivity and a high etch rate while maintaining a vertical shape in the etching.

Application Pattern of Radio-Frequency Power

Figure 6:
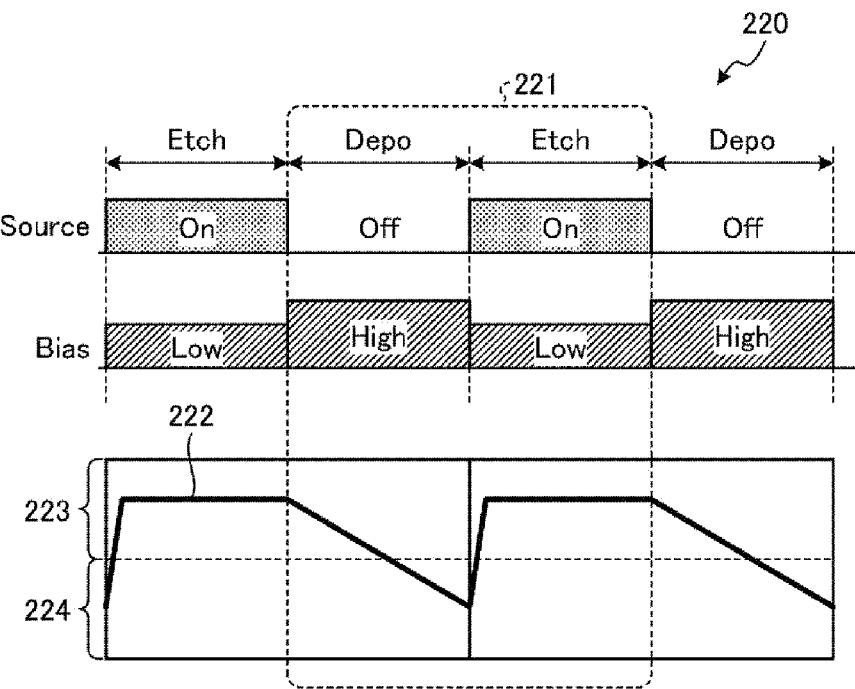
FIG. 6 is a diagram illustrating an example of the relationship between the application pattern of the radio-frequency power and the dissociation degree of the process gas.
Figure 7:
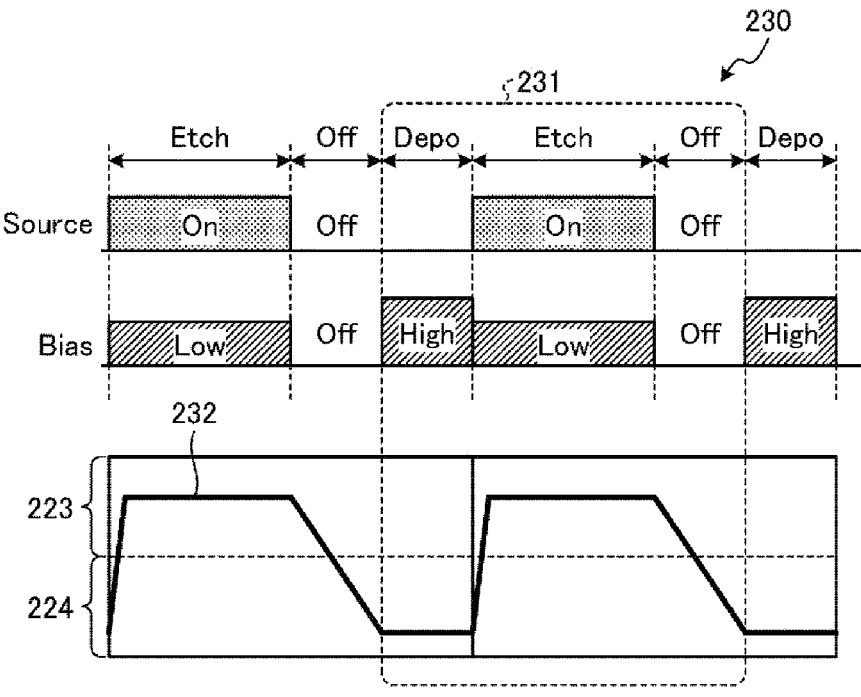
FIG. 7 is a diagram illustrating an example of the relationship between the application pattern of the radio-frequency power and the dissociation degree of the process gas.
Figure 8:
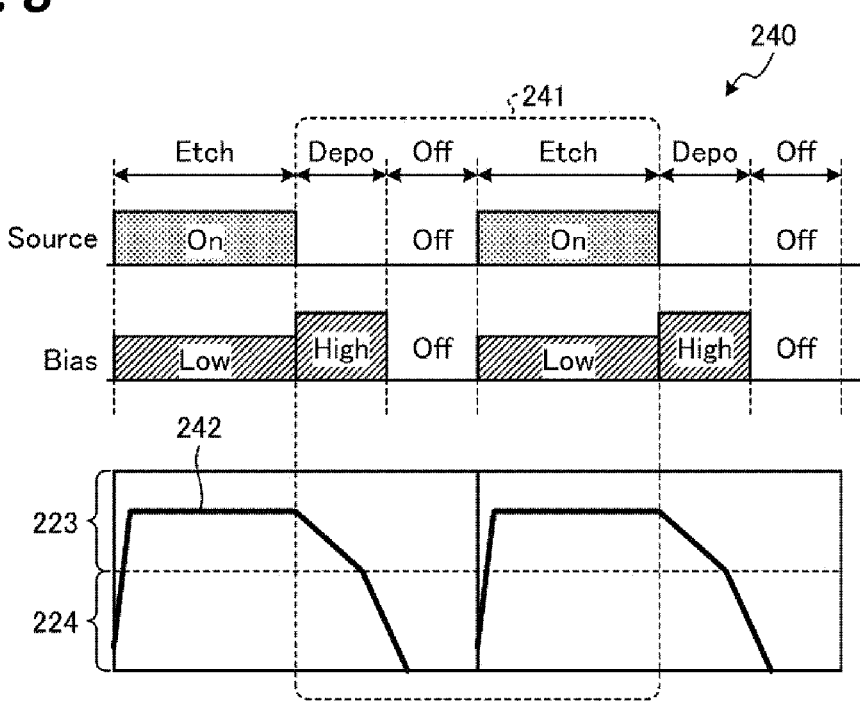
FIG. 8 is a diagram illustrating an example of the relationship between the application pattern of the radio-frequency power and the dissociation degree of the process gas.

Next, the relationship between the application power of the radio-frequency power and the dissociation degree of the process gas will be described with reference to FIGS. 6 to 8. FIGS. 6 to 8 are diagrams illustrating an example of the relationship between the application pattern of the radio-frequency power and the dissociation degree of the process gas.

The application pattern 220 illustrated in FIG. 6 is an example of a pattern in which one or more of the first radio-frequency power (Bias) and the second radio-frequency power (Source) are always supplied during a cycle 221, which is a unit cycle. In the application pattern 220, the first radio-frequency power is switched between "High" and "Low," and the second radio-frequency power is switched between "Off" and "On." The first radio-frequency power may be set to, for example, 150 W (CW) for "High" and 75 W (CW) for "Low." Further, the second radio-frequency power may be set to, for example, 0 W for "Off" and 1,100 W for "On," that is, 1,100 W (10 Hz, duty ratio of 50%).

In the application pattern 220, the graph 222 illustrating the dissociation degree of the process gas is in the high dissociation etching region 223 when the second radio-frequency power is "On" and the first radio-frequency power is "Low." When the second radio-frequency power is switched to "Off" and the first radio-frequency power is switched to "High," the dissociation degree decreases, and the deposition region 224 with low dissociation gradually changes. In the application pattern 220, the cycle 221 is repeated, thereby repeating the deposition step and the etching step.

The application pattern 230 illustrated in FIG. 7 is an example of a pattern in which the time during which the first radio-frequency power (Bias) is "Off" and the second radio-frequency power (Source) is also "Off," is present in a cycle 231, which is a unit cycle. That is, the application pattern 230 includes a step of not generating new plasma by applying a radio-frequency power. In the application pattern 230, the first radio-frequency power is switched among "High," "Low," and "Off" and the second radio-frequency power is switched between "Off" and "On." The first radio-frequency power may be set to, for example, 150 W (CW) for "High," 75 W (CW) for "Low," and W for "Off." Further, the second radio-frequency power may be set to, for example, W for "Off" and 1,100 W for "On," that is, 1,100 W (10 Hz, duty ratio of 50%).

In the application pattern 230, the graph 232 illustrating the dissociation degree of the process gas is in the high dissociation etching region 223 when the second radio-frequency power is "On" and the first radio-frequency power is "Low." When both the first radio-frequency power and the second radio-frequency power are "Off," the graph 232 transitions rapidly to the low dissociation deposition region 224. After that, when the second radio-frequency power becomes "Off" and the first radio-frequency power becomes "High," the graph 232 is in a state where a constant dissociation degree is maintained in the low dissociation deposition region 224. In the application pattern 230, the cycle 231 is repeated, thereby repeating the deposition step and the etching step.

The application pattern 240 illustrated in FIG. 8 is an example of a pattern in which the time during which the first radio-frequency power and the second radio-frequency power (Source) are both "Off" after "High" of the first radio-frequency power (Bias), is present in a cycle 241, which is a unit cycle. That is, the application pattern 240 includes a step of not generating new plasma by applying a radio-frequency power. In the application pattern 240, the first radio-frequency power is switched among "High," "Off," and "Low," and the second radio-frequency power is switched between "Off" and "On." The first radio-frequency power may be set to, for example, 150 W (CW) for "High," 0 W for "Off," and 75 W (CW) for "Low." Further, the second radio-frequency power may be set to, for example, 0 W for "Off" and 1,100 W for "On," that is, 1,100 W (10 Hz, duty ratio of 50%).

In the application pattern 240, the graph 242 illustrating the dissociation degree of the process gas is in the high dissociation etching region 223 when the second radio-frequency power is "On" and the first radio-frequency power is "Low." When the second radio-frequency power is switched to "Off" and the first radio-frequency power is switched to "High," the dissociation degree decreases, and when both the first radio-frequency power and the second radio-frequency power are switched to "Off," the graph 242 transitions rapidly to the low dissociation deposition region 224, but then to an undissociated state. In the application pattern 240, the cycle 241 is repeated, thereby repeating the deposition step and the etching step.

In the application pattern of the radio-frequency power, in a case where the dissociation degree of the process gas transitions from the high dissociation state (etching) to the low dissociation state (deposition), when there is a residual component in the high dissociation state during the low dissociation state, the deposition characteristics may be affected. Therefore, as in the application pattern 230, when switching from the high dissociation state to the low dissociation state, it is more desirable to wait for application of the first radio-frequency power until the residual component in the high dissociation state disappears. When transitioning from the low dissociation state to the high dissociation state, even if there is a residual component in the low dissociation state, it dissociates as it is. Thus, the etching characteristics are less affected.

State of Wafer During Plasma Processing

Figure 9:
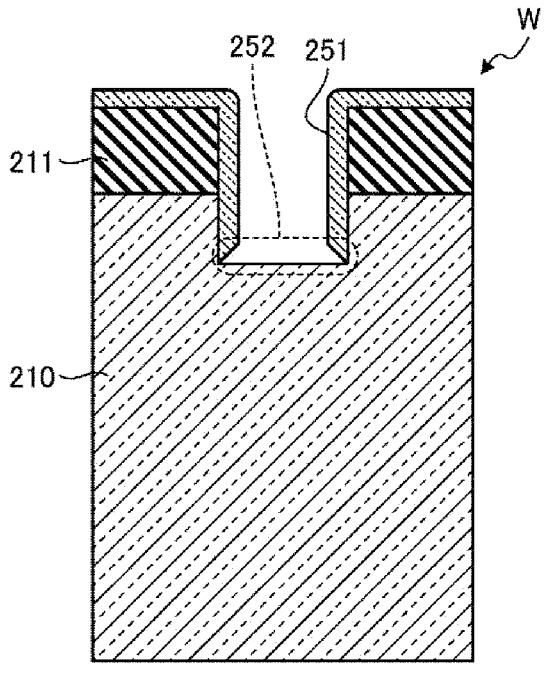
FIG. 9 is a view schematically illustrating an example of the state of a wafer during the plasma processing.

Subsequently, the state of the wafer during the plasma processing will be described with reference to FIG. 9. FIG. 9 is a view schematically illustrating an example of the state of a wafer during the plasma processing. FIG. 9 schematically illustrates a cross section of the wafer W during the plasma processing, showing a state where a hole is etched from the opening of the mask 211 to the etching target film 210. A protective film 251 is formed by the deposit on the surface of the mask 211 and the side wall of the hole.

Meanwhile, the protective film 251 is not formed on a bottom 252 of the hole. At the bottom 252 of the hole, the deposition step and the etching step are repeated, thereby minutely repeating formation of the protective film 251 on the side wall of the hole, etching of the bottom 252 of the hole, and formation of the protective film 251 on the etching target film 210 on the side wall of the hole exposed by the etching. As a result, damage to the side wall of the hole may be reduced.

Test Results

Figure 10:
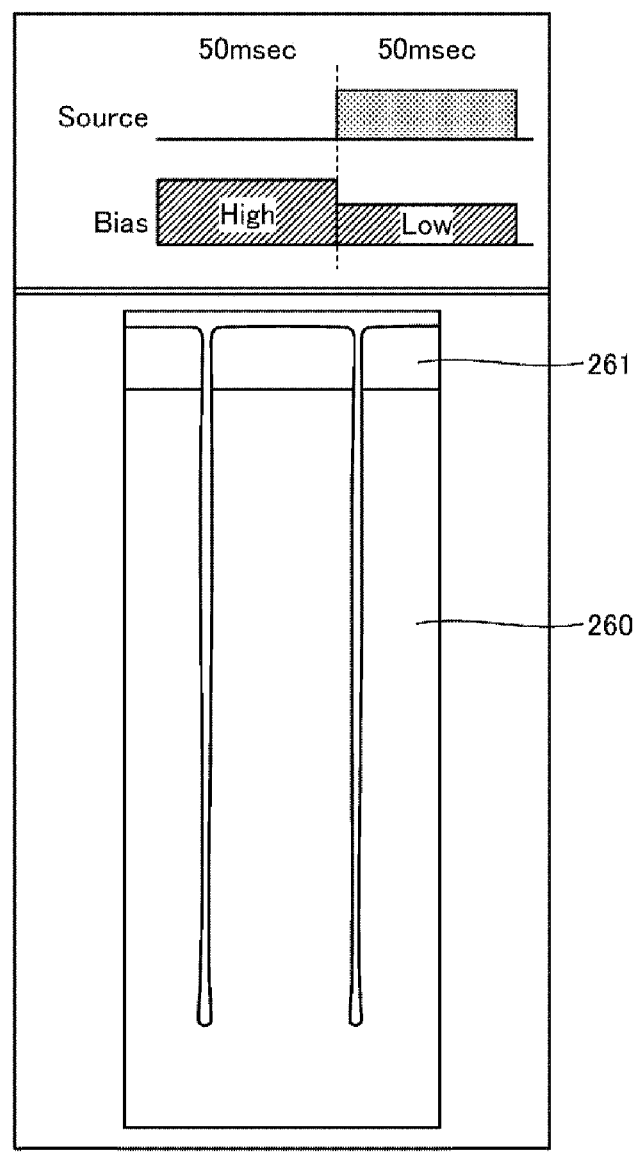
FIG. 10 is a view illustrating an example of test results in the first embodiment.

Next, the test results will be described with reference to FIGS. 10 and 11. FIG. 10 is a view illustrating an example of test results in the first embodiment. As illustrated in FIG. 10, in a test of the first embodiment, a radio-frequency power is applied to a wafer W having a silicon oxide film 261 as a mask on a silicon film 260 in the application pattern 220 illustrated in FIG. 6. The first radio-frequency power (Bias) is set to 75 W (CW) for "Low" and 150 W (CW) for "High." Further, the second radio-frequency power (Source) is set to 1,100 W (10 Hz, duty ratio of 50%). That is, in the application pattern in FIG. 10, one cycle is 100 msec, and the deposition and the etching are switched every 50 msec. That is, the etching is switched to the deposition at a timing when the protective film on the side wall disappears. A mixed gas of $C_4F_8$, $C_4F_6$, $SF_6$, and Ar was used as the process gas. Further, the processing time was 900 seconds, and the pressure inside the processing chamber 104 was 20 mTorr. As a result, the side wall of the hole etched in the silicon film 260 was smooth without scallops which are damage cutting out the wall surface.

Figure 11:
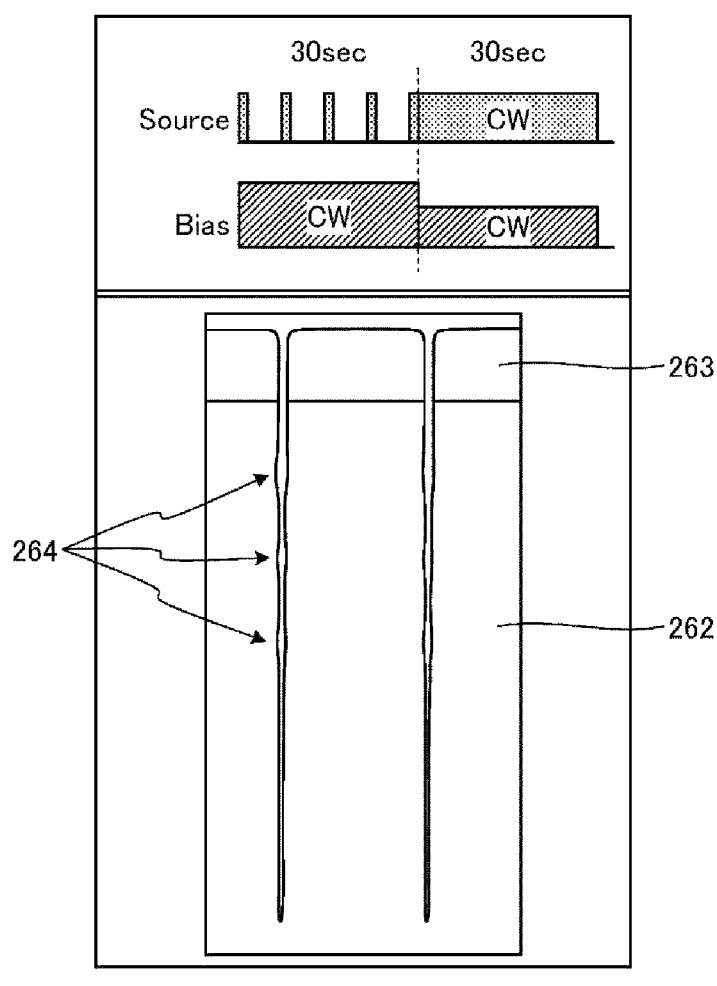
FIG. 11 is a view illustrating an example of test results in a comparative example.

FIG. 11 is a view illustrating an example of test results in a comparative example. As illustrated in FIG. 11, in a test in the comparative example, a radio-frequency power is applied to a wafer having a silicon oxide film 263 as a mask on a silicon film 262 in an application pattern that switches between deposition and etching every 30 seconds for each of source (Source) and bias (Bias). The source is set to 1,100 W (1 kHz, duty ratio of 5%) during the deposition, and 1,100 W (CW) during the etching. Further, the bias is set to 125 W (CW) during the deposition, and 75 W (CW) during the etching. That is, in the application pattern in FIG. 11, one cycle is 60 msec, and the deposition and the etching are switched every 30 msec. A mixed gas of $C_4F_8$, $C_4F_6$, $SF_6$, and Ar was used as the process gas. Further, the processing time was 10 cycles (600 seconds), and the pressure inside the processing chamber 104 was 20 mTorr. As a result, scallops 264 occurred on the side wall of the hole etched in the silicon film 262 according to the switching between deposition and the etching. As illustrated in the test results of FIGS. 10 and 11, in the first embodiment, etching may be performed with low damage.

Second Embodiment

In the first embodiment described above, the deposit 212 is formed on the mask 211 and on the side wall of the hole in the etching target film by the first plasma. However, the deposit may adhere to the middle portion of the hole by the third plasma in which a dissociation degree of the process gas is higher than that of the first plasma and lower than that of the second plasma. The same reference numerals are assigned to the same configurations as those of the plasma processing apparatus 100 of the first embodiment, and redundant descriptions of the configurations and operations will be omitted. Further, in the following description, the first plasma is low dissociation plasma, the second plasma is high dissociation plasma, and the third plasma is medium dissociation plasma.

Figure 12:
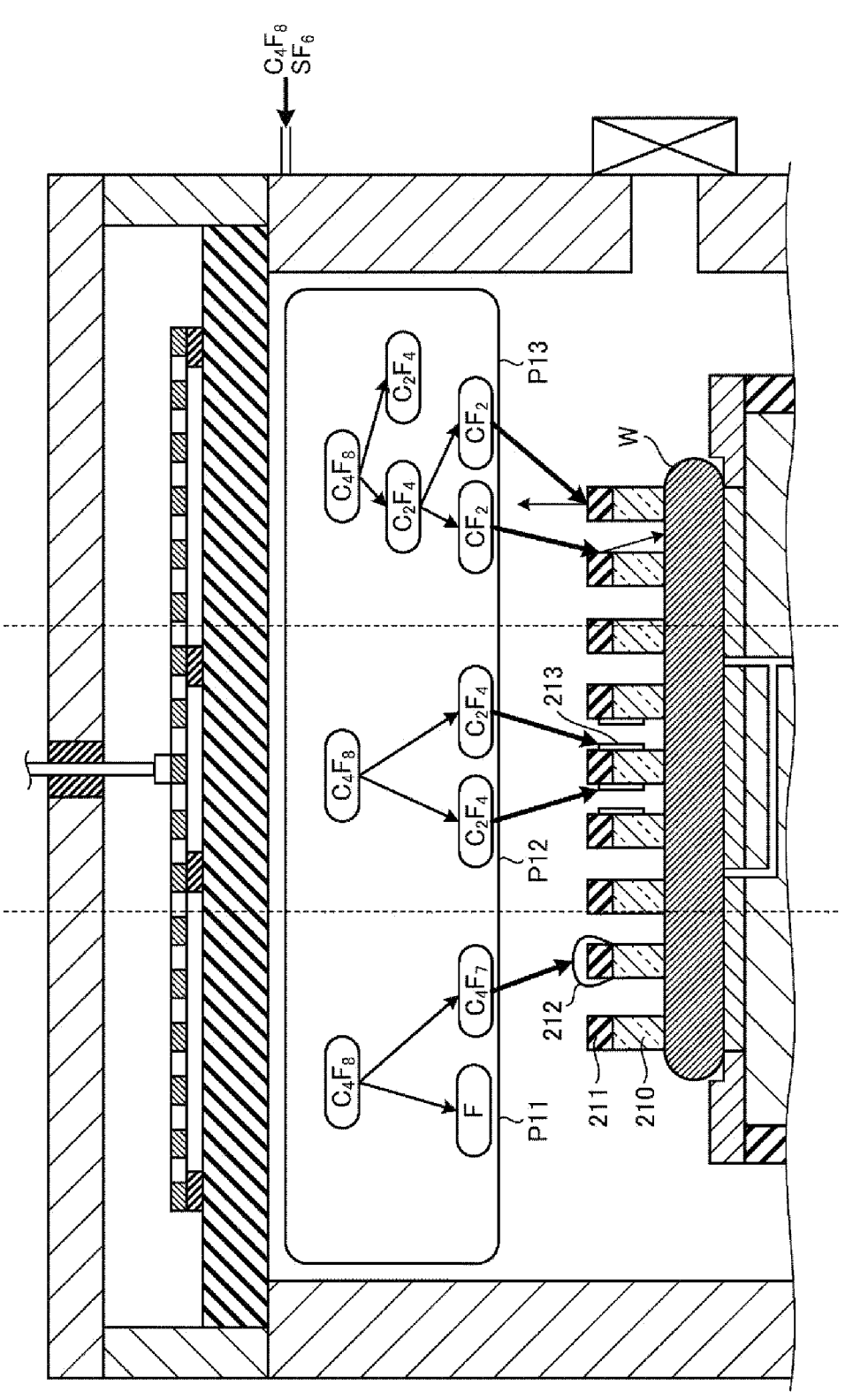
FIG. 12 is a view illustrating an example of reactions by high dissociation plasma, medium dissociation plasma, and low dissociation plasma in a second embodiment.

First, the reaction in each plasma in the second embodiment will be described with reference to FIG. 12. FIG. 12 is a view illustrating an example of reactions by high dissociation plasma, medium dissociation plasma, and low dissociation plasma in the second embodiment. FIG. 12 schematically illustrates reaction states in low dissociation plasma P11 in the left of the figure, in medium dissociation plasma P12 in the center, and in high dissociation plasma in the right so as to be viewed at a glance. As illustrated in FIG. 12, the processing chamber 104 is introduced with a fluorocarbon gas such as $C_4F_8$ or $C_4F_6$ as a main gas, and a halogen-containing gas such as $SF_6$ or $NF_3$ as an additive gas. It is desirable that the halogen-containing gas does not contain carbon. Further, since the halogen-containing gas is supplied to supplement the etchant, it may not be supplied in some cases. Furthermore, it is assumed that an etching target film 210, which is a silicon film, and a mask 211, which is a silicon oxide film, are formed on the wafer W. The wafer W, the etching target film 210, and the mask 211 are schematically illustrated in an enlarged scale.

In the low dissociation plasma P11, similar to the low dissociation plasma P1 illustrated in FIG. 4, $C_4F_8$ is dissociated into, for example, $C_4F_7$ and F, and $SF_6$ is dissociated into, for example, $SF_5$ and F. In FIG. 12, illustration of $SF_6$ is omitted. In this case, while $C_4F_7$ is generated as a large amount of deposits, the etchant (F) generated from $SF_6$ is in a small amount. Since $C_4F_7$ has a high adhesion coefficient, the deposit (reaction product) 212 is formed on the mask 211 and on the upper portion of the side wall of the hole in the etching target film 210. That is, a precursor is generated in the low dissociation plasma P11 and forms a deposit on the wafer W. Meanwhile, as the etching progresses and the hole in the etching target film 210 becomes deeper, the hole may be clogged with deposit 212 in the low dissociation plasma P11. Therefore, clogging of the hole may be suppressed by using the medium dissociation plasma P12 described below.

In the medium dissociation plasma P12, $C_4F_8$ is dissociated into, for example, $C_2F_4$ and $C_2F_4$, and $SF_6$ is dissociated into, for example, $SF_5$ and F. In FIG. 12, illustration of $SF_6$ is omitted. In this case, while $C_2F_4$ is generated as a deposit, the etchant (F) generated from $SF_6$ is in a small amount. Since $C_2F_4$ has a medium adhesion coefficient, a deposit (reaction product) 213 is not formed on the mask 211, but is formed on a middle portion of the side wall of the hole in the etching target film 210. That is, a precursor is generated in the medium dissociation plasma P12 and forms a deposit on the wafer W.

In the high dissociation plasma P2, similar to the high dissociation plasma P2 illustrated in FIG. 4, $C_4F_8$ is dissociated into, for example, $C_2F_4 \rightarrow CF_2$, and also dissociated into $CF_2 \rightarrow CF$ and F. Further, $SF_6$ is dissociated into, for example, $SF_x$ and a plurality of F's. In FIG. 12, illustration of $SF_6$ is omitted. In this case, a large amount of etchant ($CF_2$, F) is generated. Further, since $CF_2$ has a low adhesion coefficient, it reaches the bottom of the hole, so that etching progresses. That is, a precursor is generated in the high dissociation plasma P13 and etches the etching target film.

Etching Method

Figure 13:
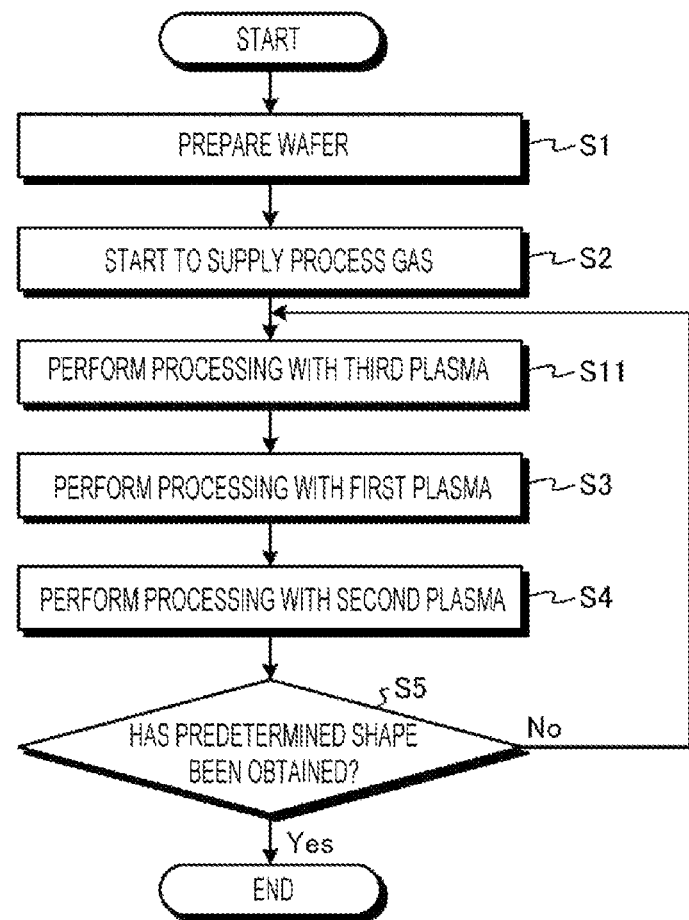
FIG. 13 is a flowchart illustrating an example of the etching processing in the first embodiment.

Next, an etching method according to the second embodiment will be described. FIG. 13 is a flowchart illustrating an example of the etching processing in the first embodiment.

Subsequent to step S2, the control unit 20 controls the radio-frequency power supply 128 to supply a first radio-frequency power (bias) for plasma excitation and bias to the susceptor 126. Here, the applied power (output) of the first high-frequency power is set to a higher value than that when the first plasma is generated. By supplying the first radio-frequency power for plasma excitation and bias to the susceptor 126, plasma is generated from the mixed gas in the space S. That is, in the space S, a precursor that forms a deposit is generated by the third plasma (medium dissociation plasma P12) generated by the first radio-frequency power. The wafer W is subjected to a plasma processing by the generated plasma. That is, the control unit 20 performs a plasma processing on the wafer W with the third plasma generated from the process gas under a third plasma generation condition (step S11). The wafer W is exposed to the third plasma, and the deposit (reaction product) 213 is formed on the side wall of the hole in the etching target film 210. The third plasma is capacitively coupled plasma (CCP) generated by the first radio-frequency power applied to the susceptor 126. Subsequently, the process proceeds to step S3.

As in the first embodiment, the control unit 20 may include a step of stopping the supply of the first radio-frequency power and the second radio-frequency power to stop the generation of plasma for a predetermined time, between steps S3 and S4 or between steps S4 and S5. Further, instead of executing step S11 immediately before step S3, the control unit 20 may execute step S11 immediately after step S3, that is, between steps S3 and S4.

As described above, in the second embodiment, by using the medium dissociation plasma P12, the middle portion of the side wall of the hole may be protected while suppressing the clogging of the hole. That is, by controlling the dissociation degree of the process gas by the level of the first radio-frequency power, and by switching between, among the depositional precursors, the generation of the depositional precursor that is likely to be deposited on the upper surface of the mask 211, and the generation of the precursor that is likely to be deposited on the side surface of the mask 211 and the etching target film 210 that is etched, the conformal formation of the protective film may be facilitated. Further, by protecting the portion of the side wall of the etched hole that is likely to have a bowing shape, it is possible to easily obtain a vertical shape in the subsequent etching step.

Application Pattern of Radio-Frequency Power

Next, the relationship between the application power of the radio-frequency power and the dissociation degree of the process gas in the second embodiment will be described with reference to FIGS. 14 to 17. FIGS. 14 to 17 are diagrams illustrating an example of the relationship between the application pattern of the radio-frequency power and the dissociation degree of the process gas.

Figure 14:
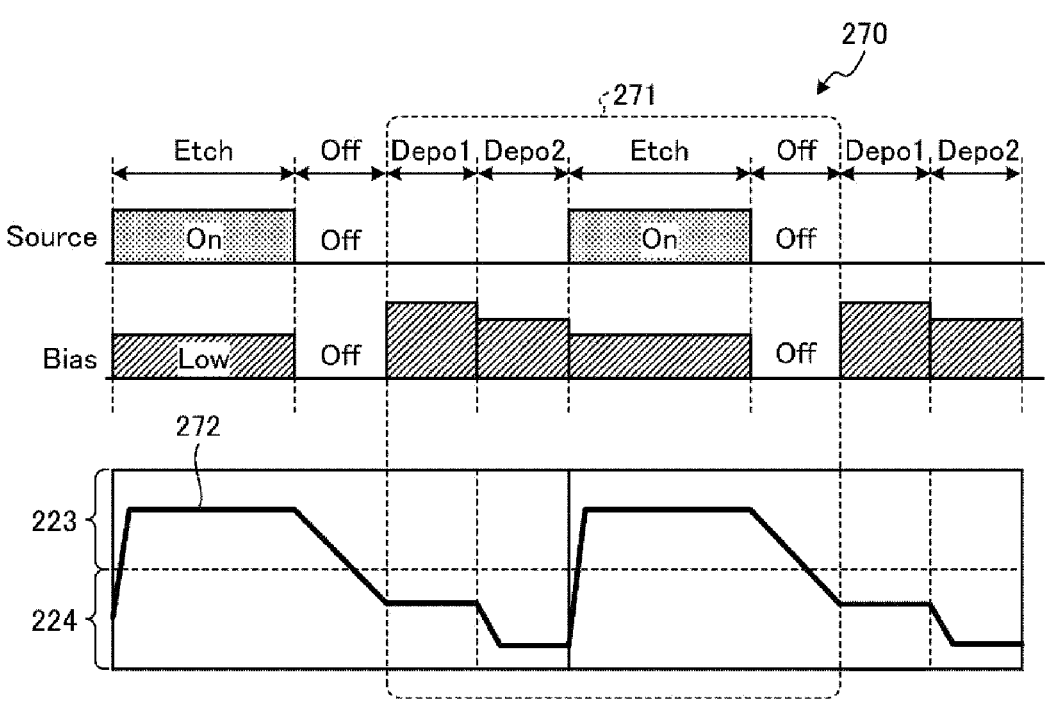
FIG. 14 is a diagram illustrating an example of the relationship between the application pattern of the radio-frequency power and the dissociation degree of the process gas.

The application pattern 270 illustrated in FIG. 14 is an example of a pattern in which the time during which the first radio-frequency power (Bias) is "Off" and the second radio-frequency power (Source) is also "Off," is present in a cycle 271, which is a unit cycle, and the first radio-frequency power is output in three stages. That is, the application pattern 270 includes a step of not generating new plasma by applying a radio-frequency power. In the application pattern 270, the first radio-frequency power is switched among "High," "Middle," "Low," and "Off," and the second radio-frequency power is switched between "Off" and "On." In FIG. 14, "High," "Middle," and "Low" of the first radio-frequency power are represented by the height of the graph. The first radio-frequency power may be set to, for example, 225 W (CW) for "High," 150 W (CW) for "Middle," 75 W (CW) for "Low," and 0 W for "Off." That is, "Middle" of the application pattern 270 corresponds to "High" of the application pattern 230 illustrated in FIG. 7 in the first embodiment. The "High" section corresponds to the third plasma generation condition, the "Middle" section corresponds to the first plasma generation condition, and the "Low" section corresponds to the second plasma generation condition. Further, the second radio-frequency power may be set to, for example, 0 W for "Off" and 1,100 W for "On," that is, 1,100 W (10 Hz, duty ratio of 50%).

In the application pattern 270, the graph 272 illustrating the dissociation degree of the process gas is in the high dissociation etching region 223 when the second radio-frequency power is "On" and the first radio-frequency power is "Low." When both the first radio-frequency power and the second radio-frequency power are "Off," the graph 272 transitions rapidly to the low dissociation deposition region 224. After that, when the second radio-frequency power becomes "Off" and the first radio-frequency power becomes "High," the graph 272 is in a state where a constant dissociation degree is maintained in a region close to the high dissociation etching region 223 in the low dissociation deposition region 224, that is, in the medium dissociation deposition region 224 ("Depo 1" section in FIG. 14). Next, when the second radio-frequency power becomes "Off" and the first radio-frequency power becomes "Middle," the graph 272 transitions to the lower dissociation side in the low dissociation deposition region 224, and the constant dissociation and stays in a state where a constant dissociation degree is maintained ("Depo2" section in FIG. 14). In the application pattern 270, the cycle 271 is repeated, thereby repeating the medium dissociation and low dissociation deposition steps and the etching step.

Figure 15:
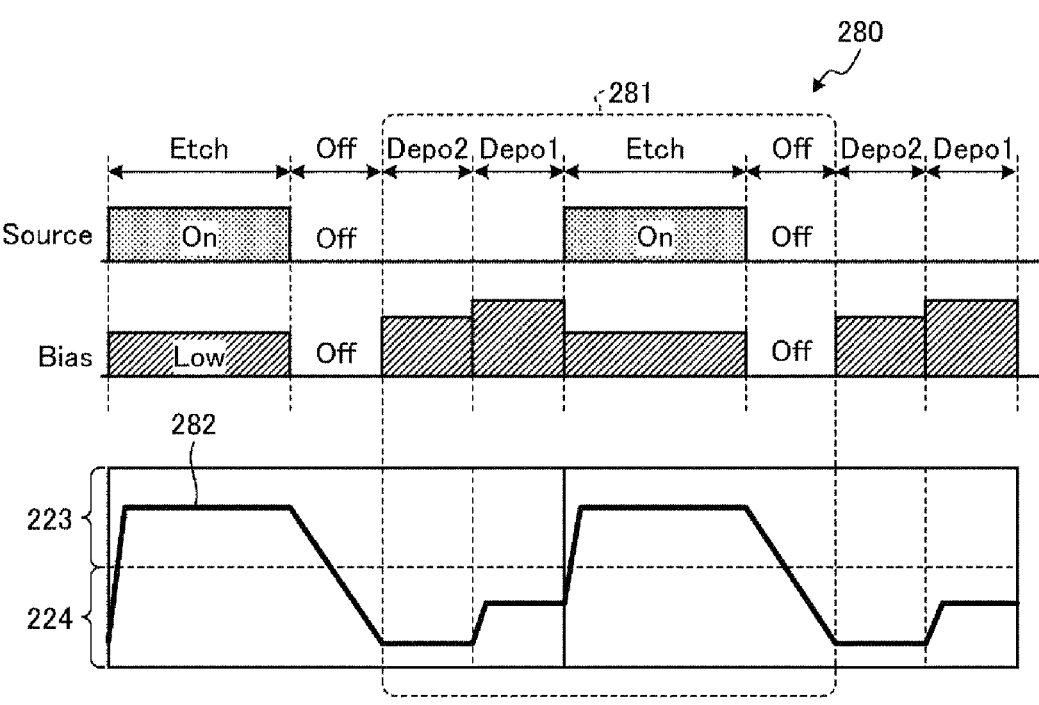
FIG. 15 is a diagram illustrating an example of the relationship between the application pattern of the radio-frequency power and the dissociation degree of the process gas.

An application pattern 280 illustrated in FIG. 15 is an application pattern in which "High" and "Middle" of the first radio-frequency power are reversed from the application pattern 270 illustrated in FIG. 14. The first radio-frequency power may be set to, for example, 225 W (CW) for "High," 150 W (CW) for "Middle," 75 W (CW) for "Low," and 0 W for "Off." Further, the second radio-frequency power may be set to, for example, 0 W for "Off" and 1,100 W for "On," that is, 1,100 W (10 Hz, duty ratio of 50%).

In the application pattern 280, the graph 282 illustrating the dissociation degree of the process gas is in the high dissociation etching region 223 when the second radio-frequency power is "On" and the first radio-frequency power is "Low." When both the first radio-frequency power and the second radio-frequency power are "Off," the graph 282 transitions rapidly to the low dissociation deposition region 224. After that, when the second radio-frequency power becomes "Off" and the first radio-frequency power becomes "Middle," the graph 282 is in a state where a constant dissociation degree is maintained in a region far from the high dissociation etching region 223 in the low dissociation deposition region 224 ("Depo2" section in FIG. 15). Next, when the second radio-frequency power becomes "Off" and the first radio-frequency power becomes "Middle," the graph 272 transitions to a region close to the high dissociation etching region 223 in the low dissociation deposition region 224, that is, to the medium dissociation deposition region 224 and stays in a state where a constant dissociation degree is maintained ("Depo1" section in FIG. 15). In the application pattern 280, the cycle 281 is repeated, thereby repeating the low dissociation and medium dissociation deposition steps and the etching step.

Figure 16:
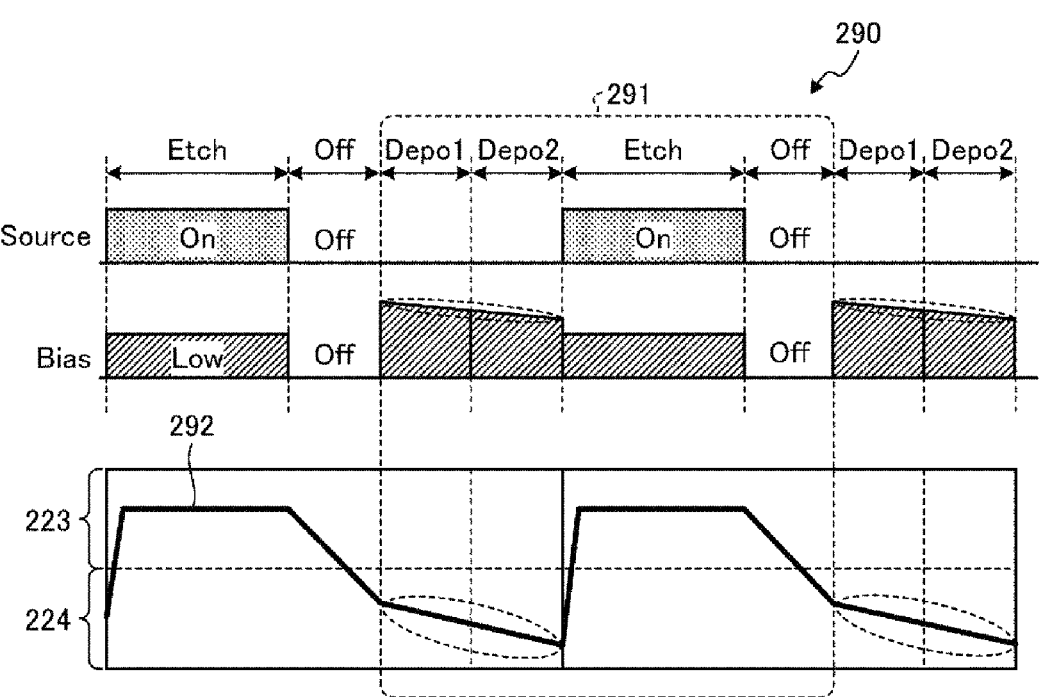
FIG. 16 is a diagram illustrating an example of the relationship between the application pattern of the radio-frequency power and the dissociation degree of the process gas.

An application pattern 290 illustrated in FIG. 16 is an application pattern in which the applied power corresponding to "High" and "Middle" of the first radio-frequency power with respect to the application pattern 270 illustrated in FIG. 14 changes from the "High" value to the "Middle" value over time. The first radio-frequency power may be set to, for example, 225 W (CW) for the initial value of "High," 150 W (CW) for the final value of "Middle," 75 W (CW) for "Low," and 0 W for "Off." Further, the second radio-frequency power may be set to, for example, 0 W for "Off" and 1,100 W for "On," that is, 1,100 W (10 Hz, duty ratio of 50%).

In the application pattern 290, the graph 292 illustrating the dissociation degree of the process gas is in the high dissociation etching region 223 when the second radio-frequency power is "On" and the first radio-frequency power is "Low." When both the first radio-frequency power and the second radio-frequency power become "Off," the graph 292 transitions rapidly to the low dissociation deposition region 224. After that, the graph 292 indicates that when the second radio-frequency power becomes "Off" and the first radio-frequency power changes from "High" to "Middle" over time, the dissociation degree also changes over time in accordance with the change in the first radio-frequency power. In this case, the graph 292 is in a state where the slope becomes gentle in a region close to the high dissociation etching region 223 in the low dissociation deposition region 224, that is, in the medium dissociation region, and gradually transitions to the low dissociation side (a section from "Depot" to "Depot" in FIG. 16). In the application pattern 290, the cycle 291 is repeated, thereby repeating the medium dissociation and low dissociation deposition steps and the etching step. The section from "Depo 1" to "Depo2" may not only change linearly over time, but may also change over time in a curved line as indicated by dotted lines.

Figure 17:
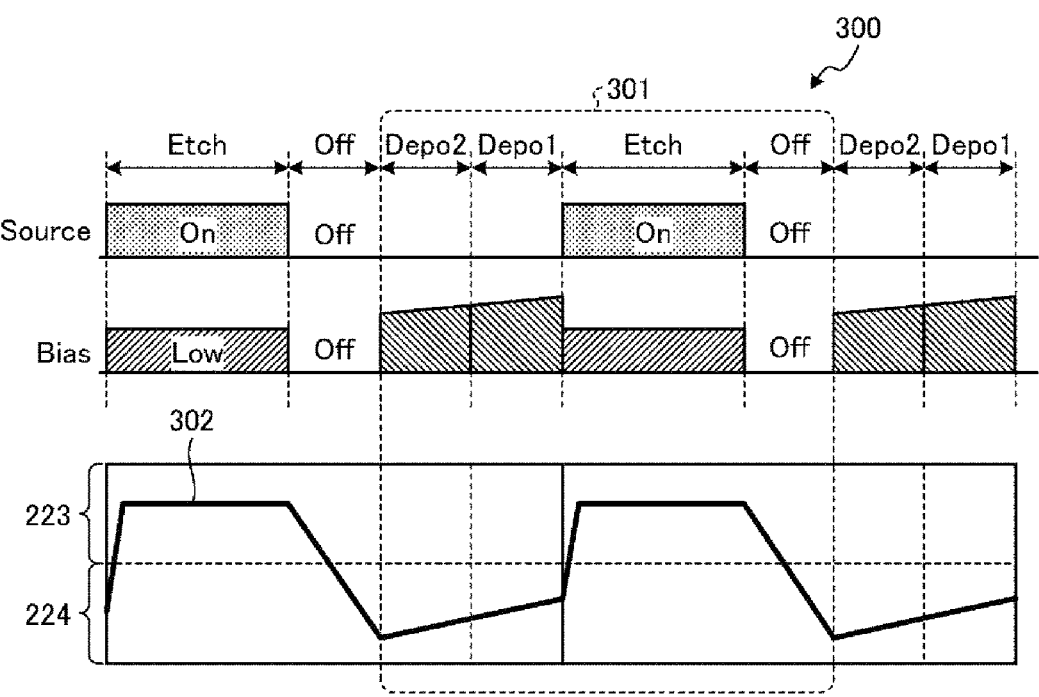
FIG. 17 is a diagram illustrating an example of the relationship between the application pattern of the radio-frequency power and the dissociation degree of the process gas.

An application pattern 300 illustrated in FIG. 17 is an application pattern in which the change over time of the first radio-frequency power is opposite to the application pattern 290 illustrated in FIG. 16. The first radio-frequency power may be set to, for example, 225 W (CW) for the final value of "High," 150 W (CW) for the initial value of "Middle," 75 W (CW) for "Low," and 0 W for "Off." Further, the second radio-frequency power may be set to, for example, 0 W for "Off" and 1,100 W for "On," that is, 1,100 W (10 Hz, duty ratio of 50%).

In the application pattern 300, the graph 302 illustrating the dissociation degree of the process gas is in the high dissociation etching region 223 when the second radio-frequency power is "On" and the first radio-frequency power is "Low." When both the first radio-frequency power and the second radio-frequency power become "Off," the graph 302 transitions rapidly to the low dissociation deposition region 224. After that, the graph 302 indicates that when the second radio-frequency power becomes "Off" and the first radio-frequency power changes from "Middle" to "High" over time, the dissociation degree also changes over time in accordance with the change in the first radio-frequency power. In this case, the graph 302 is in a state where, in the low dissociation deposition region 224, the slope is reversed in a low dissociation side region far from the high dissociation etching region 223, and the graph gradually transitions to a region close to the high dissociation etching region 223 in the low dissociation deposition region 224, that is, in the medium dissociation region (a section from "Depo2" to "Depo 1" in FIG. 17). In the application pattern 300, the cycle 301 is repeated, thereby repeating the low dissociation and medium dissociation deposition steps and the etching step. The section from "Depo2" to "Depo1" may not only change linearly over time, but may also change over time in a curved line as indicated by dotted lines, as in FIG. 16.

Further, in the application patterns 270, 280, 290, and 300 illustrated in FIGS. 14 to 17, by changing one or more of the applied powers of "High" and "Middle" of the first radio-frequency power and the processing time, the attachment points of the deposits 212 and 213 may be controlled to be from the top of the mask 211 to the middle portion of the side wall of the hole in the etching target film 210. The changes over time in the first plasma generation condition and the third plasma generation condition illustrated in the application patterns 290 and 300 may be applied to the first plasma generation condition in the application patterns 220, 230, and 240 of the first embodiment.

Under each plasma generation condition, the first radio-frequency power may be controlled according to, for example, the etching depth of the hole in the etching target film. In this case, the deposition of the deposit on the upper portion of the mask 211 is emphasized at the start of etching, so that, for example, the first radio-frequency power is applied according to the applied power and the processing time corresponding to "High" illustrated in the application pattern 230 of the first embodiment. When the etching progresses to the middle position of the hole, the deposition of the deposit on the side wall of the hole is emphasized, so that, for example, the first radio-frequency power is applied according to the applied power and the processing time of "High" and "Middle" illustrated in the application pattern 270. Furthermore, when the etching progresses to a deeper position of the hole, the etching is emphasized, so that, for example, the applied power of "High" and "Middle" illustrated in the applied pattern 270 is lowered, and the processing time is shortened. In this way, by changing the first radio-frequency power and the processing time in the low dissociation and medium dissociation deposition steps and the etching step, it is possible to control the deposition locations of the deposit.

Modification

In each of the above embodiments, the first plasma (low dissociation plasma P1, P11) and the third plasma (medium dissociation plasma P12) are capacitively coupled plasmas (CCP), and the second plasma (high dissociation plasma P2, P13) is an inductively coupled plasma (ICP), but is not limited thereto. As a combination of plasma generation methods, a combination of capacitively coupled plasma (CCP) as the first plasma and the third plasma and microwave plasma as the second plasma may also be used. Further, it is also possible to use a combination of low-output inductively coupled plasma (ICP) as the first plasma, medium-output inductively coupled plasma (ICP) as the third plasma, and high-output inductively coupled plasma (ICP) as the second plasma, by relatively changing the output of the radio-frequency power. Further, it is also possible to use a combination of low-frequency inductively coupled plasma (ICP) as the first plasma, medium-frequency inductively coupled plasma (ICP) as the third plasma, and high-frequency inductively coupled plasma (ICP) as the second plasma, by relatively changing the frequency of the radio-frequency power. Further, it is also possible to use a combination of low-output capacitively coupled plasma (CCP) as the first plasma, medium-output capacitively coupled plasma (CCP) as the third plasma, and high-output capacitively coupled plasma (CCP) as the second plasma, by relatively changing the output of the radio-frequency power. Further, it is also possible to use a combination of low-power capacitively coupled plasma (CCP) as the first plasma, medium-power capacitively coupled plasma (CCP) as the third plasma, and high-power capacitively coupled plasma (CCP) as the second plasma, by relatively changing the frequency of the radio-frequency power. In this case, the radio-frequency power on the first plasma and third plasma sides is also expressed as LF (Low Frequency), and the radio-frequency power on the second plasma side is also expressed as HF (High Frequency). Each of the modifications described above also includes a combination of the first plasma and the second plasma (a combination without the third plasma).

As described above, according to the first embodiment, the control unit 20 executes (a) supplying a process gas with a specific condition, to a processing container (the chamber 101, the processing chamber 104) having therein a stage (the susceptor 126) on which a workpiece (the wafer W) having an etching target film and a mask on the etching target film is placed. The control unit 20 executes (b) performing a plasma processing on the workpiece with first plasma generated from the process gas under a first plasma generation condition. The control unit 20 executes (c) performing a plasma processing on the workpiece with second plasma generated from the process gas under a second plasma generation condition that is different from the first plasma generation condition in a radio-frequency condition and a processing time, and is the same as the first plasma generation condition in other conditions. The control unit 20 executes (d) repeating (b) and (c). As a result, it is possible to perform etching at a higher speed and with less damage, as compared to the gas switching method.

Further, according to each embodiment, the second plasma is in a state where a dissociation degree of the process gas is higher than that of the first plasma. As a result, the deposition step and the etching step may be repeated.

Further, according to each embodiment, in (b), a protective film is formed on the workpiece by a reaction product generated by the first plasma. Further, in (c), the etching target film is etched by an etchant generated by the second plasma. As a result, generation of scallops may be suppressed on the side wall of the hole.

Further, according to each embodiment, the second plasma generation condition is a condition in which a bias potential is generated on the workpiece. As a result, the etching target film may be etched.

Further, according to the first embodiment, the control unit 20 executes (e) performing a processing in which no plasma is generated. Further, (d) repeats (b), (c), and (e) in an order of (b), (c), and (e). As a result, the dissociation degree of the process gas may be rapidly changed from a high dissociation state to a low dissociation state.

Further, according to the first embodiment, a condition of the process gas introduced in (e) is the same as conditions of the process gas introduced in (b) and (c). As a result, it is possible to suppress a decrease in throughput due to switching of process gases.

Further, according to each embodiment, the etching target film is a silicon film, the mask is a silicon-containing film, and the process gas includes fluorocarbon gas or hydrofluorocarbon gas. As a result, the silicon film may be etched.

Further, according to each embodiment, the process gas further includes a halogen-containing gas. As a result, more etchant may be supplied in the high dissociation state.

Further, according to each embodiment, the halogen-containing gas does not contain carbon. As a result, generation of reaction products may be suppressed in the high dissociation state.

Further, according to each embodiment, the process gas includes a first gas capable of generating a precursor that forms a deposit on the workpiece by being dissociated by plasma, and a second gas capable of generating a precursor that etches the etching target film by being dissociated by the plasma. As a result, generation of scallops may be suppressed on the side wall of the hole.

Further, according to each embodiment, the first plasma is capacitively coupled plasma, and the second plasma is inductively coupled plasma. As a result, it is possible to perform etching at a higher speed and with less damage, as compared to the gas switching method.

Further, according to each embodiment, the first plasma is capacitively coupled plasma, and the second plasma is microwave plasma. As a result, it is possible to perform etching at a higher speed and with less damage, as compared to the gas switching method.

Further, according to each embodiment, the first plasma and the second plasma are inductively coupled plasma or capacitively coupled plasma, and a frequency of the radio-frequency power in the second plasma generation condition is higher than a frequency of the radio-frequency power in the first plasma generation condition. As a result, the deposition step and the etching step may be repeated.

Further, according to each embodiment, the first plasma and the second plasma are inductively coupled plasma or capacitively coupled plasma, and an applied power of a radio-frequency power in the second plasma generation condition is higher than an applied power of the radio-frequency power in the first plasma generation condition. As a result, the deposition step and the etching step may be repeated.

Further, according to each embodiment, the first plasma generation condition includes changing the applied power over time as the radio-frequency power condition. As a result, it is possible to control the extent of the protective film due to the reaction product.

Further, according to each embodiment, the radio-frequency power condition and the processing time in the first and second plasma generation conditions are adjusted according to a depth of the etching target film that is etched. As a result, generation of scallops may be suppressed on the side wall of the hole.

Further, according to the second embodiment, the control unit 20 executes (f) performing a plasma processing on the workpiece with third plasma generated from the process gas under a third plasma generation condition that is different from the first and second plasma generation conditions in the radio-frequency condition and the processing time, and is the same as the first and second plasma generation conditions in other conditions. Further, (f) is performed immediately before and/or immediately after (b). As a result, it is possible to protect the middle portion of the side wall of the hole while suppressing clogging of the hole.

Further, according to the second embodiment, the third plasma is in a state where a dissociation degree of the process gas is higher than that of the first plasma and lower than that of the second plasma. As a result, it is possible to protect the middle portion of the side wall of the hole while suppressing clogging of the hole.

Further, according to the second embodiment, in (f), a protective film is formed on the workpiece by a reaction product generated by the third plasma. As a result, it is possible to protect the middle portion of the side wall of the hole.

Further, according to the second embodiment, the protective film is formed on a top surface of the mask by the reaction product generated by the first plasma, and the protective film is formed on a side surface of the mask and a side surface of the etching target film that is etched, by the reaction product generated by the third plasma. As a result, it is possible to protect from the upper surface of the mask to the middle portion of the side wall of the hole.

Further, according to the second embodiment, the third plasma is inductively coupled plasma or capacitively coupled plasma, and a frequency of the radio-frequency power in the third plasma generation condition is higher than a frequency of the radio-frequency power in the first plasma generation condition and lower than a frequency of the radio-frequency power in the second plasma generation condition. As a result, two kinds of the deposition steps and the etching step may be repeated.

Further, according to the second embodiment, the third plasma is inductively coupled plasma or capacitively coupled plasma, and an applied power of a radio-frequency power in the third plasma generation condition is higher than an applied power of the radio-frequency power in the first plasma generation condition and lower than an applied power of the radio-frequency power in the second plasma generation condition. As a result, two kinds of the deposition steps and the etching step may be repeated.

Further, according to the second embodiment, the radio-frequency power condition and the processing time in the first, second, and third plasma generation conditions are adjusted according to a depth of the etching target film that is etched. As a result, it becomes easier to obtain a vertical shape on the side wall of the hole.

Further, according to the second embodiment, the first and third plasma generation conditions include changing the applied power over time as the radio-frequency power condition. As a result, it is possible to control the extent of the protective film due to the reaction product.

Each embodiment disclosed this time should be considered as being illustrative and not restrictive in all respects. Each of the above embodiments may be omitted, substituted, or modified in various ways without departing from the scope and spirit of the appended claims.

Further, in each of the above embodiments, inductively coupled plasma (ICP), capacitively coupled plasma (CCP), and microwave plasma are described as plasma sources, but the present invention is not limited to these. For example, any plasma source such as magnetron plasma may be used as the plasma source.

Further, in each of the above embodiments, a silicon film is used as the etching target film, but the film is not limited thereto. For example, the present disclosure be applied to etching using various silicon-containing films such as silicon oxide films and silicon nitride films as the etching target film.

DESCRIPTION OF SYMBOLS

10: main body
20: control unit
100: plasma processing apparatus
101: chamber
103: antenna chamber
104: processing chamber
115, 128: radio-frequency power supply 120: gas supply mechanism
124: gas supply pipe
126: susceptor
131: electrostatic chuck
S: space
W: wafer

What is claimed is:

1. A substrate processing method for a substrate processing apparatus, the method comprising:
 (a) supplying a process gas with a specific condition, to a processing container having therein a stage on which a workpiece having an etching target film and a mask on the etching target film is placed;
 (b) performing a plasma processing on the workpiece with first plasma generated from the process gas under a first plasma generation condition, and forming a protective film on the workpiece by a reaction product generated by the first plasma;
 (c) performing a plasma processing on the workpiece with second plasma generated from the process gas under a second plasma generation condition that is different from the first plasma generation condition in a radio-frequency condition and a processing time, and is same as the first plasma generation condition in other conditions, and etching the etching target film by an etchant generated by the second plasma; and
 (d) repeating (b) and (c), wherein
 the second plasma is in a state where a dissociation degree of the process gas is higher than that of the first plasma.

2. The substrate processing method according to claim 1, wherein the second plasma generation condition is a condition in which a bias potential is generated on the workpiece.

3. The substrate processing method according to claim 1, wherein the etching target film is a silicon film,
 the mask is a silicon-containing film, and
 the process gas includes fluorocarbon gas or hydrofluorocarbon gas.

4. The substrate processing method according to claim 3, wherein the process gas further includes a halogen-containing gas.

5. The substrate processing method according to claim 4, wherein the halogen-containing gas does not contain carbon.

6. The substrate processing method according to claim 1, wherein the process gas includes:
 a first gas capable of generating a precursor that forms a deposit on the workpiece by being dissociated by plasma, and
 a second gas capable of generating a precursor that etches the etching target film by being dissociated by the plasma.

7. The substrate processing method according to claim 1, wherein the first plasma is capacitively coupled plasma, and the second plasma is inductively coupled plasma.

8. The substrate processing method according to claim 1, wherein the first plasma is capacitively coupled plasma, and the second plasma is microwave plasma.

9. The substrate processing method according to claim 1, wherein the first plasma and the second plasma are inductively coupled plasma or capacitively coupled plasma, and
 a frequency of the radio-frequency power in the second plasma generation condition is higher than a frequency of the radio-frequency power in the first plasma generation condition.

10. The substrate processing method according to claim 1, wherein the first plasma and the second plasma are inductively coupled plasma or capacitively coupled plasma, and an applied power of a radio-frequency power in the second plasma generation condition is higher than an applied power of the radio-frequency power in the first plasma generation condition.

11. The substrate processing method according to claim 10, wherein the first plasma generation condition includes changing the applied power over time as the radio-frequency power condition.

12. The substrate processing method according to claim 1, wherein the radio-frequency power condition and the processing time in the first and second plasma generation conditions are adjusted according to a depth of the etching target film that is etched.

13. A substrate processing method for a substrate processing apparatus, the method comprising:
 (a) supplying a process gas with a specific condition, to a processing container having therein a stage on which a workpiece having an etching target film and a mask on the etching target film is placed;
 (b) performing a plasma processing on the workpiece with first plasma generated from the process gas under a first plasma generation condition;
 (c) performing a plasma processing on the workpiece with second plasma generated from the process gas under a second plasma generation condition that is different from the first plasma generation condition in a radio-frequency condition and a processing time, and is same as the first plasma generation condition in other conditions;
 (e) performing a processing in which no plasma is generated; and
 (f) repeating (b), (c), and (e) in an order of (b), (c), and (e).

14. The substrate processing method according to claim 13, wherein a condition of the process gas introduced in (e) is same as conditions of the process gas introduced in (b) and (c).

15. A substrate processing method for a substrate processing apparatus, the method comprising:
 (a) supplying a process gas with a specific condition, to a processing container having therein a stage on which a workpiece having an etching target film and a mask on the etching target film is placed;
 (b) performing a plasma processing on the workpiece with first plasma generated from the process gas under a first plasma generation condition,
 (c) performing a plasma processing on the workpiece with second plasma generated from the process gas under a second plasma generation condition that is different from the first plasma generation condition in a radio-frequency condition and a processing time, and is same as the first plasma generation condition in other conditions;
 (d) repeating (b) and (c); and
 (f) performing a plasma processing on the workpiece with third plasma generated from the process gas under a third plasma generation condition that is different from the first and second plasma generation conditions in the radio-frequency condition and the processing time, and is same as the first and second plasma generation conditions in other conditions,
 wherein (f) is performed immediately before and/or immediately after (b).

16. The substrate processing method according to claim 15, wherein the third plasma is in a state where a dissociation degree of the process gas is higher than that of the first plasma and lower than that of the second plasma.

17. The substrate processing method according to claim 16, wherein the third plasma is inductively coupled plasma or capacitively coupled plasma, and a frequency of the radio-frequency power in the third plasma generation condition is higher than a frequency of the radio-frequency power in the first plasma generation condition and lower than a frequency of the radio-frequency power in the second plasma generation condition.

18. The substrate processing method according to claim 16, wherein the third plasma is inductively coupled plasma or capacitively coupled plasma, and an applied power of a radio-frequency power in the third plasma generation condition is higher than an applied power of the radio-frequency power in the first plasma generation condition and lower than an applied power of the radio-frequency power in the second plasma generation condition.

19. The substrate processing method according to claim 18, wherein the first and third plasma generation conditions include changing the applied power over time as the radio-frequency power condition.

20. The substrate processing method according to claim 16, wherein the radio-frequency power condition and the processing time in the first, second, and third plasma generation conditions are adjusted according to a depth of the etching target film that is etched.

21. The substrate processing method according to claim 15, wherein, in (f), a protective film is formed on the workpiece by a reaction product generated by the third plasma.

22. The substrate processing method according to claim 21, wherein the protective film is formed on a top surface of the mask by the reaction product generated by the first plasma, and the protective film is formed on a side surface of the mask and a side surface of the etching target film that is etched, by the reaction product generated by the third plasma.

* * * * *